United States Patent
Pro et al.

(10) Patent No.: US 8,520,342 B1
(45) Date of Patent: Aug. 27, 2013

(54) CONSTANT IMPEDANCE AND VARIABLE BANDWIDTH TRACES FOR AN INTEGRATED LEAD SUSPENSION

(75) Inventors: John D. Pro, Prior Lake, MN (US); Michael E. Roen, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 1202 days.

(21) Appl. No.: 12/248,455

(22) Filed: Oct. 9, 2008

Related U.S. Application Data

(60) Provisional application No. 60/998,165, filed on Oct. 9, 2007.

(51) Int. Cl.
*G11B 5/48* (2006.01)

(52) U.S. Cl.
USPC .................................................. 360/245.9

(58) Field of Classification Search
USPC ............. 360/244, 244.3, 244.4, 245.8, 245.9, 360/246
See application file for complete search history.

(56) References Cited

U.S. PATENT DOCUMENTS

| | | | | |
|---|---|---|---|---|
| 5,307,031 A | * | 4/1994 | Dick | 333/28 R |
| 5,608,591 A | | 3/1997 | Klaassen | |
| 5,712,749 A | * | 1/1998 | Gustafson | 360/246 |
| 6,038,102 A | * | 3/2000 | Balakrishnan et al. | 360/264.2 |
| 6,331,919 B1 | | 12/2001 | Klaassen et al. | |
| 6,356,113 B1 | | 3/2002 | Contreras et al. | |
| 6,596,184 B1 | * | 7/2003 | Shum et al. | 216/13 |
| 6,603,623 B1 | | 8/2003 | Fontana, Jr. et al. | |
| 6,621,373 B1 | * | 9/2003 | Mullen et al. | 333/81 A |
| 6,673,256 B2 | | 1/2004 | Takasugi | |
| 6,714,385 B1 | * | 3/2004 | Even et al. | 360/246 |
| 6,728,057 B2 | | 4/2004 | Putnam | |
| 6,741,141 B2 | | 5/2004 | Kormanyos | |
| 6,762,913 B1 | * | 7/2004 | Even et al. | 360/246 |
| 7,158,348 B2 | | 1/2007 | Erpelding et al. | |
| 7,161,767 B2 | | 1/2007 | Hernandez et al. | |
| 7,352,535 B2 | * | 4/2008 | Arya et al. | 360/245.9 |
| 7,489,479 B2 | * | 2/2009 | Arya et al. | 360/245.9 |
| 7,660,074 B1 | * | 2/2010 | Webb et al. | 360/245.8 |
| 7,929,252 B1 | * | 4/2011 | Hentges et al. | 360/245.9 |
| 8,189,297 B2 | * | 5/2012 | Arai | 360/246 |
| 8,194,354 B1 | * | 6/2012 | Zhang et al. | 360/245.9 |
| 2002/0181156 A1 | * | 12/2002 | Shiraishi et al. | 360/245.9 |
| 2007/0133128 A1 | | 6/2007 | Arai | |
| 2011/0149442 A1 | * | 6/2011 | Contreras et al. | 360/245.8 |

* cited by examiner

*Primary Examiner* — Angel Castro
(74) *Attorney, Agent, or Firm* — Faegre Baker Daniels LLP

(57) ABSTRACT

An integrated lead flexure includes a base region and a gimbal extending from the base region and having a slider mounting region. A conductive assembly, which is configured to carry current between the slider mounting region and the base region, includes a current carrying structure electrically connected with a pattern of conductive lossy material. The pattern of conductive lossy material is configured to reduce a bandwidth of the current carrying structure.

19 Claims, 8 Drawing Sheets

CONSTANT IMPEDANCE AND VARIABLE BANDWIDTH TRACES FOR AN INTEGRATED LEAD SUSPENSION

CROSS-REFERENCE TO RELATED APPLICATION

This application claims the benefit of provisional application Ser. No. 60/998,165, filed Oct. 9, 2007, entitled "CONSTANT IMPEDANCE AND VARIABLE BANDWIDTH TRACES FOR AN INTEGRATED LEAD SUSPENSION," which is hereby incorporated by reference in its entirety.

TECHNICAL FIELD

The present invention relates generally to an integrated lead suspension of the type used in a magnetic disk drive or other dynamic data storage system. More particularly, the present invention, relates to traces on an integrated lead suspension having a controllable impedance and bandwidth.

BACKGROUND

Integrated lead or wireless flexures and suspensions of the type incorporated into disk drives are well known. With the continuing evolution of disk drives there is a need to reduce the physical size of the flexures and suspensions while at the same time enhancing their mechanical and electrical performance characteristics. Known approaches for meeting these objectives can be conflicting and may present difficult design optimization issues.

For example, high trace electrical bandwidths can lead to excessive signal reflections. These reflections can be caused by intrinsic parasitic capacitance in the disk drive preamplifiers to which the traces are connected. It is known to form windows below the traces in the stainless steel layers of flexures and suspensions, but this design parameter impacts both impedance and bandwidth in a given design space region. There is a need for improved flexure and suspension structures and associated methods relating to design spaces that are relatively sensitive to bandwidth changes while being relatively insensitive to impedance changes.

SUMMARY

In one embodiment, the present invention relates to an integrated lead flexure including a base region and a gimbal extending from the base region and having a slider mounting region. A conductive assembly, which is configured to carry current between the slider mounting region and the base region, includes a current carrying structure electrically connected with a pattern of conductive lossy material. The pattern of conductive material is configured to reduce a bandwidth of the current carrying structure.

In another embodiment, the present invention relates to an assembly for carrying current along a flexure of an integrated lead suspension. The assembly includes a current carrying structure having first impedance and a first bandwidth and a pattern of conductive lossy material electrically connected to the current carrying structure. The electrically connected current carrying structure and pattern of conductive lossy material has a second impedance substantially equal to the first impedance and a second bandwidth less than the first bandwidth.

In a further embodiment, the present invention relates to an assembly for carrying current along a flexure of an integrated lead suspension including a current carrying structure having a major dimension. A plurality of spaced-apart lossy material members are coupled with the current carrying structure along its major dimension.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
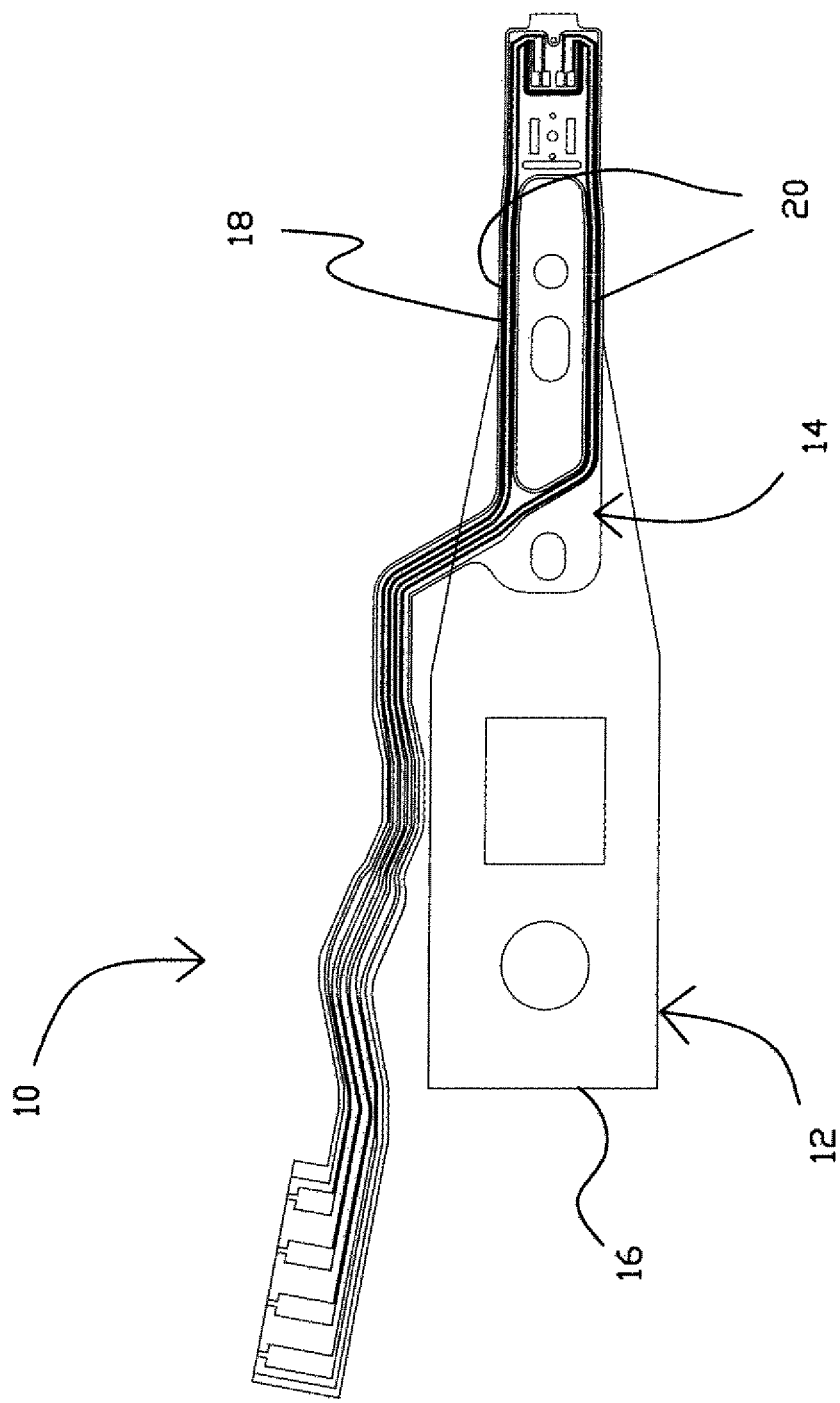
FIG. 1 is a plan view of a disk drive head suspension assembly including a load beam and an integrated flexure according to embodiments of the present invention.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

FIG. 1 is plan view of a disk drive head suspension assembly 10 including a load beam 12 and a flexure 14. The load beam 12 includes a proximal actuator arm base region 16 configured for mounting the head suspension assembly 10 to an actuator arm (not shown), and a distal end region 18 to which the flexure 14 is attached. The flexure 14 is configured to support a magnetic head slider (not shown), and includes a plurality of conductive leads 20 (also known as traces) electrically coupling the head slider to other electronic circuitry of the disk drive.

Figure 2:
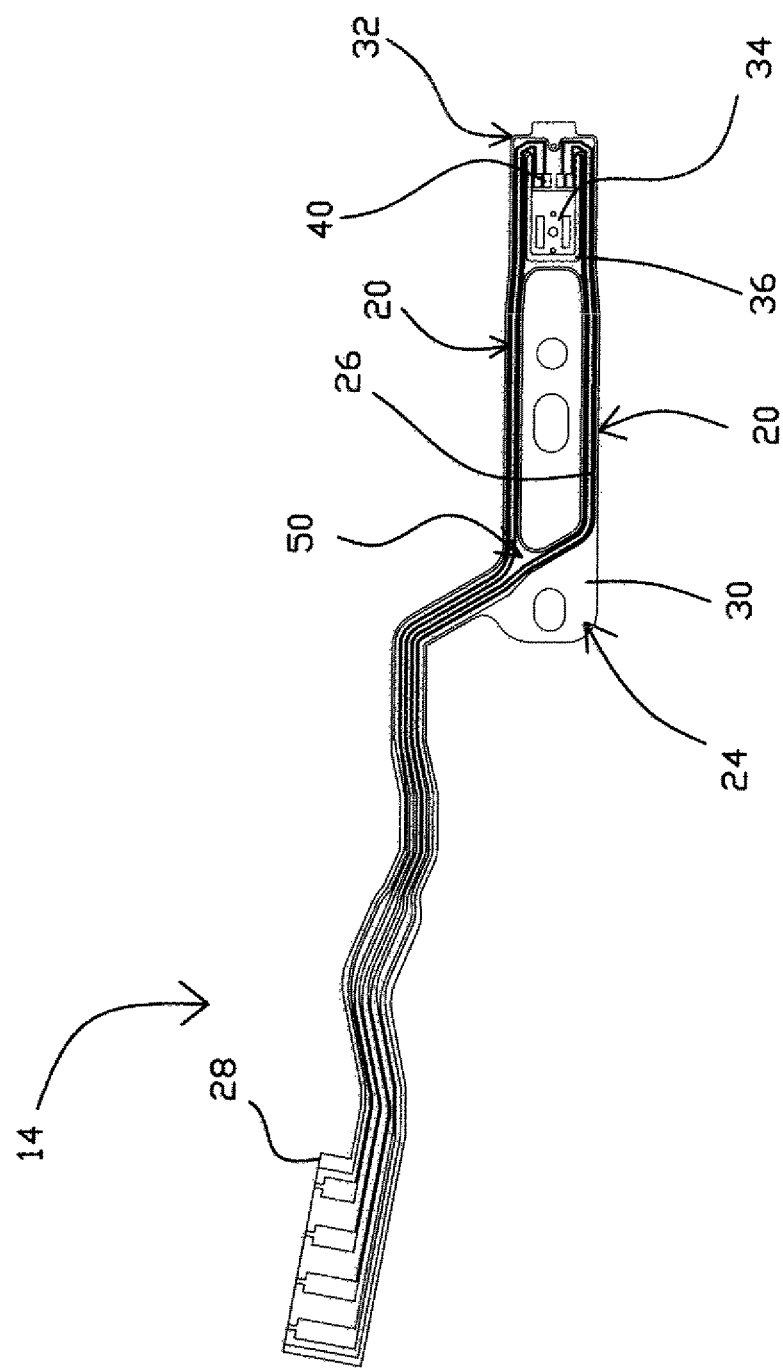
FIG. 2 is a plan view of the flexure of the head suspension assembly of FIG. 1.

FIG. 2 is a plan view of the flexure 14 separate from the load beam 12. The flexure 14 includes a generally flat spring metal layer 24 having a major surface 26, a proximal tail region 28, a base region 30, and a distal gimbal region 32. The gimbal region 32 includes a tongue 34 defined by a channel 36 formed through the spring metal layer 24. The tongue 34 operates to support the magnetic head slider (not shown) as is known in the art, and is designed to be resiliently moveable with respect to the remainder of the flexure 14 in response to aerodynamic forces exerted on the head slider during operation of the disk drive. The base region 30 is adapted to engage with the load beam 12, and may include various tabs, apertures, and offsets (not shown) to facilitate attachment with the load beam (typically by welding). The spring metal layer 24 can assume a variety of shapes and sizes without departing from the scope of the invention.

The flexure 14 is an integrated lead or wireless structure, with the conductive leads 20 applied over the major surface 26 of the spring metal layer 24 extending from the gimbal region 32 to the tail region 28 of the flexure 14. The conductive leads 20 operate to electrically couple the magnetic head (not shown) and external circuitry (not shown) attached to the conductive leads 20 in the tail region 28 of the flexure 14. In the illustrated embodiment, each of the conductive leads 20 includes a head bonding pad portion 40 in the distal gimbal region 32 adjacent the tongue 34. The magnetic head may be attached to the tongue 34, e.g., using an adhesive. The head bonding pad portion 40 of each respective lead 20 may be electrically connected, e.g., by soldering, to a terminal pad on the magnetic head.

The flexure 14 also includes a dielectric layer 50 between the leads 20 and the spring metal layer 24. The dielectric layer 50 operates to support the leads 20 and to electrically isolate the spring metal layer 24 from the leads 20.

The spring metal layer 24, the leads 20, and the dielectric layer 50 can be made from any materials known in the art or later developed for comparable structures in head suspension flexures. In one embodiment, the spring metal layer 24 is comprised substantially of stainless steel. In various embodiments, the material making up the dielectric layer 50 is selected based on the design and functional requirements of the flexure 14 and the particular process used to form the dielectric layer 50. In one embodiment, the dielectric layer 50 is comprised of a dielectric polymer. For example, the dielectric layer 50 may be comprised of polyimide.

The conductive leads 20 may be comprised of copper or copper alloys. In other embodiments, all or portions of the conductive leads are comprised of noble metals such as gold or silver. In still other embodiments, the leads 20 have multilayer structures including layers of different conductive materials. For example, the flexure 14 may include stacked leads with layers of dielectric material disposed between adjacent lead layers. In some embodiments, the flexure 14 may include one or more conductive ground plane layers (not shown in FIGS. 1 and 2) disposed between the spring metal layer 24 and the leads 20, and optionally separated from the spring metal layer 24 by a dielectric layer. Still other materials and flexure lead and dielectric layer configurations will be apparent to those skilled in the art.

During the writing process, external circuitry, such as a write driver preamplifier, provides a signal to the conductive leads 20 in the tail region 28. The conductive leads 20 deliver the signal to the magnetic head attached to the distal gimbal region 32. A portion of this signal may be reflected back to the preamplifier which, due to the parasitic capacitance of the preamplifier, may in turn be reflected back to the magnetic head. According to the present invention, a lossy material is formed on or included in the current carrying portions of the flexure 14 to reduce the signal bandwidth of the interconnect, which reduces the reflections provided back to the magnetic head. The lossy material may be any material that dissipates electrical or magnetic energy that passes through it. At the same time, the lossy material has a minimal effect on the impedance of the current carrying portions, thereby preventing reflections in the regions of the current carrying portions including the lossy material.

FIGS. 3-8 illustrate portions of current carrying structures including a pattern of lossy material formed along the flexure 14 in accordance with embodiments of the present invention. The current carrying structures may include, for example, conductive leads 20 and/or a ground plane formed on the flexure 14. The embodiments of the flexure 14 described below may be integrated into the head suspension assembly 10 shown in FIGS. 1 and 2. In some embodiments, the flexures 14 described below are fabricated using additive (e.g., deposition) and/or subtractive (e.g., etching) processes.

Figure 3:
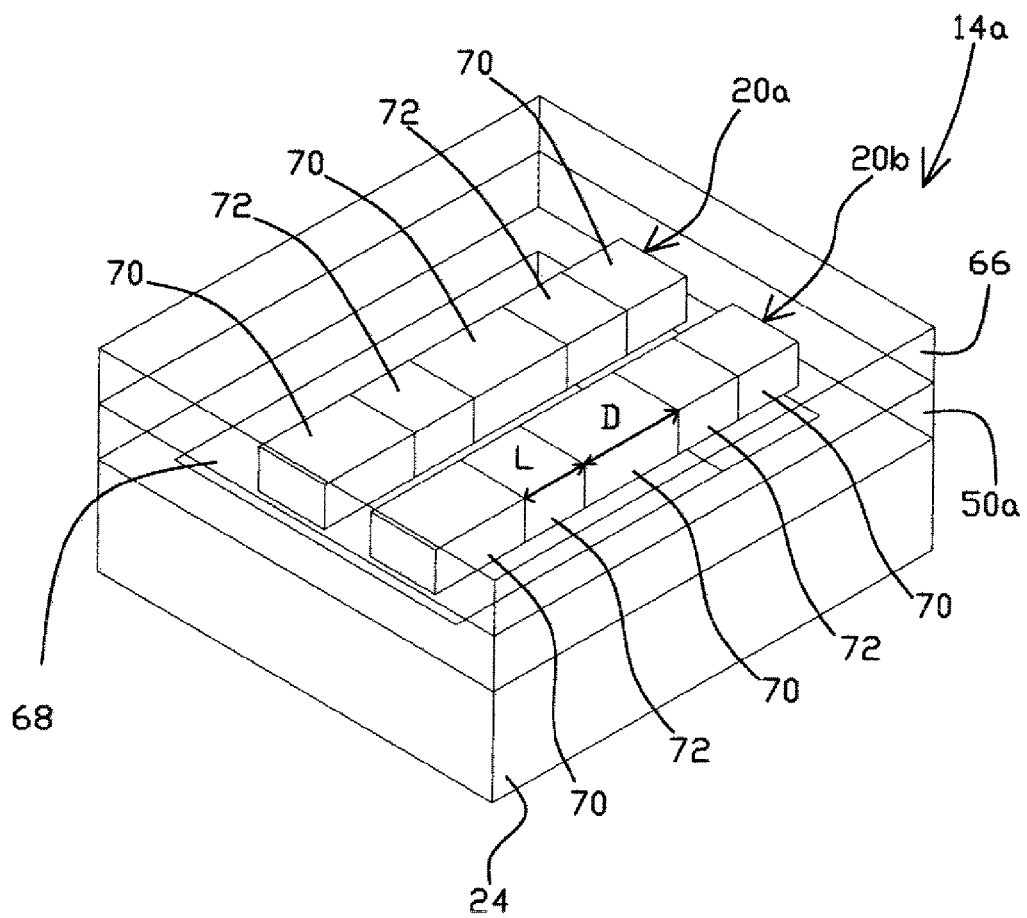
FIG. 3 is a perspective view of a portion of a lead including a pattern of lossy metal, according to an embodiment of the present invention.

FIG. 3 is a perspective view of a portion of a flexure 14a according to an embodiment of the present invention, including a spring metal layer 24, a dielectric layer 50a, leads 20a and 20b, and a cover coat layer 66. The dielectric layer 50a electrically isolates the leads 20a and 20b from the spring metal layer 24. The dielectric layer 50a may be made of materials and have a configuration similar to the dielectric layer 50 described above. The cover coat layer 66 may be comprised of a dielectric material and is formed over the leads 20a and 20b as a protective layer for the flexure 14a and to electrically isolate the leads 20a and 20b from other electrical components in the disk drive system. The cover coat layer 66 may be comprised of any suitable material, including those listed above with regard to dielectric layer 50.

In some embodiments, the spring metal layer 24 may include one or more windows 68 formed along the flexure 14a. The windows 68 are formed in the spring metal layer 24 to affect the impedance of the leads 20a and 20b. The size, shape, number, and configuration of the windows 68 can be varied to control the impedance of the leads 20a and 20b, such as to match the impedance to the loads connected to the leads 20a and 20b. For example, the spacing between the windows 68 and the length of the windows 68 along the major dimension of the flexure 14a are determinate of the impedance of the leads 20a and 20b. In embodiments of the flexure 14a including a ground plane, the windows can also affect the capacitance between the leads 20a and 20b and the ground plane. In some embodiments, the leads 20a and 20b is unsupported by the spring metal layer 24 in the portions of the leads 20a and 20b that extend over the windows 68. Alternatively, the windows 68 may be wholly or partially filled with a dielectric material.

The leads 20a and 20b may be configured to carry differential current in opposite directions between the tail region 28 and the distal gimbal region 32. It should be noted that while two leads 20a and 20b are shown, additional leads may be formed co-planar with and/or vertically disposed from the leads 20a and 20b. For example, additional pairs of leads may be arranged adjacent leads 20a and 20b to provide additional current carrying paths.

The leads 20a and 20b are comprised of a conductive trace material 70 and a plurality of spaced-apart elements 72 made of lossy material. In some embodiments, the conductive trace material 70 is copper or a copper alloy. The conductive trace material 70 may be selected with a lower intrinsic conductivity to control the bandwidth of the conductive trace material 70. The lossy material is a conductive material that is electrically connected with the conductive trace material 70. In some embodiments, the spaced-apart elements 72 comprise layers of lossy material formed over a constant layer of the conductive trace material 70. For example, the spaced-apart elements 72 may be plated on the constant layer of the conductive trace material 70 using known techniques. In other embodiments, the spaced-apart elements 72 comprise strips of lossy material interspersed with strips of the conductive trace material 70. While the spaced-apart elements 72 are shown encapsulating or formed as full thickness sections between portions of the conductive trace material 70, the lossy material may alternatively be formed on fewer than all surfaces of the conductive trace material 70. For example, the lossy material may be formed as a solid layer or as spaced-apart elements on only one surface of the conductive trace material 70, such as the surface facing the adjacent lead 20a, 20b.

The spaced-apart elements 72 are made of any lossy material that reduces the bandwidth of the leads 20a and 20b while having a minimal effect on the impedance of the leads 20a and 20b. The lossy material has a loss tangent greater than the loss tangent of the conductive trace material 70. In some embodiments, the electrical conductivity of the lossy material is lower than the electrical conductivity of the conductive trace material 70. Example lossy materials suitable for the spaced-apart elements 72 include, but are not limited to, Ni, steel, W, NiCr, Al, Cr, Fe, and alloys thereof.

The spaced-apart elements 72 may be configured to control the bandwidth of the leads 20a and 20b. For example, in embodiments in which the spaced-apart elements 72 are formed over a layer of conductive trace material 70, the thickness of the spaced-apart elements 72 may be controlled to provide the desired bandwidth while minimizing the effect of the spaced-apart elements 72 on the impedance of the leads 20a and 20b. In some embodiments, the thickness of the spaced-apart elements 72 is about 0.3-5.0 μm. In addition, the length L of each of the spaced-apart elements 72 and the distance D between each of the spaced-apart elements 72 may be selected to control the bandwidth of the leads 20a and 20b. For example, the length L of the spaced-apart elements 72 may be between about 10% and about 90% of the total length of the total length of the leads 20a and 20b. Furthermore, the pitch of the spaced-apart elements 72 may be selected to control the bandwidth of the leads 20a and 20b. In some embodiments, the pitch is less than about 5.0 mm.

The pattern of the spaced-apart elements 72 may also be varied along the flexure 14a to provide different responses along the length of the leads 20a and 20b. In some embodiments, the pattern of the spaced-apart elements 72 is constant (i.e., the length L and distance D are constant) along the length of the flexure 14. In such embodiments, the length L is not substantially smaller than the wavelength of the signal carried by the leads 20a and 20b to prevent the introduction of group delay distortions. In other embodiments, the spaced-apart elements 72 are patterned in selective regions along the flexure 14a to create discrete attenuator segments near the distal gimbal region 32 and/or the tail region 28. These attenuator segments may be configured to reduce reflections in certain places along the flexure 14a in which high levels of attenuation are desirable. In further embodiments the lossy material is plated along the entire longitudinal length of the conductive trace material 70.

Figure 4:
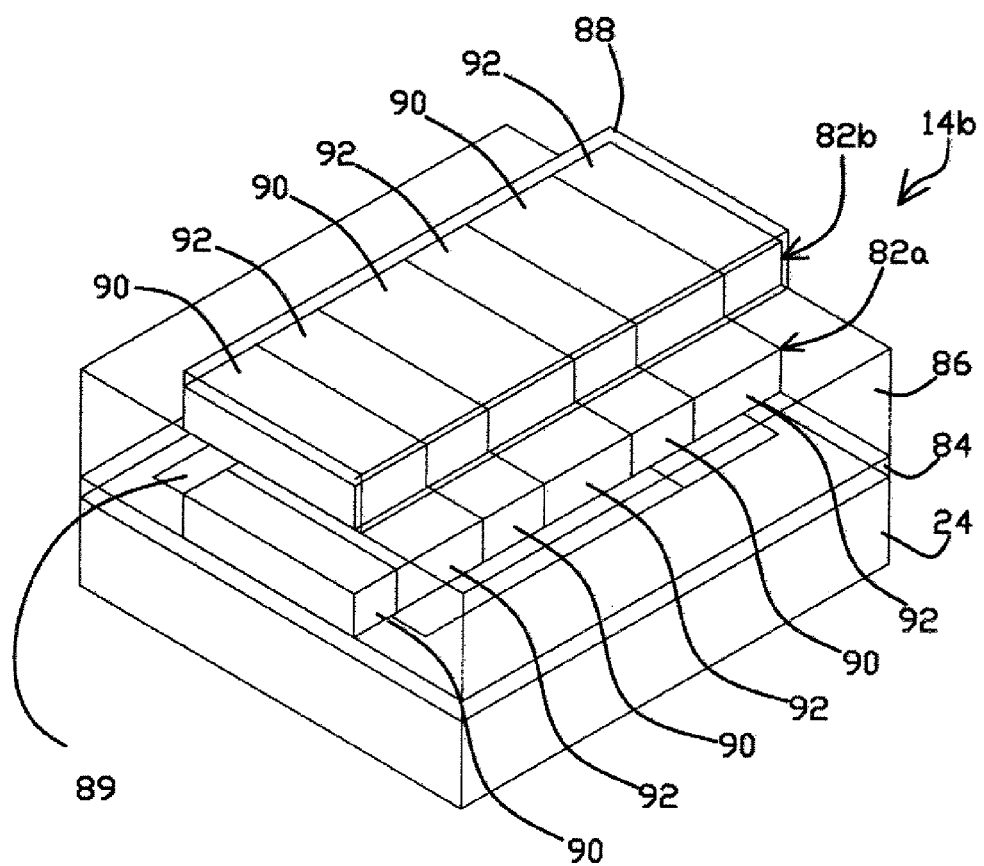
FIG. 4 is a perspective view of a portion of two vertically disposed leads including a pattern of lossy metal, according to an embodiment of the present invention.

FIG. 4 is a perspective view of a portion of a flexure 14b according to an embodiment of the present invention including a spring metal layer 24, a lower lead 82a, an upper lead 82b, a lower dielectric layer 84, an upper dielectric layer 86, and a cover coat layer 88. The dielectric layers 84 and 86 electrically isolate the lead 82a and 82b from each other and from the spring metal layer 24. The dielectric layers 84 and 86 may be comprised of materials similar to those described above with regard to dielectric layer 50 in FIG. 2. The cover coat layer 88 may be comprised of a dielectric material and is formed over the lead 82b as a protective layer for the flexure 14a and to electrically isolate the lead 82b from other electrical components in the disk drive system. In some embodiments, the spring metal layer 24 includes one or more windows 89 formed along the flexure 14b having a configuration similar to the windows 68 of the flexure 14a.

The leads 82a and 82b are vertically disposed with respect to each other relative to the spring metal layer 24 in a stacked configuration. In the embodiment shown, the leads 82a and 82b are comprised of a conductive trace material 90 and a plurality of spaced-apart elements 92 made of lossy material. In alternative embodiments, one of leads 82a and 82b includes the spaced-apart elements 92, while the other of the leads 82a and 82b only includes the conductive trace material 90. The spaced-apart elements 92 may be configured substantially similarly as described above with regard to the spaced-apart elements 72, and the spaced-apart elements 92 may be comprised of materials similar to the spaced-apart elements 72.

Figure 5:
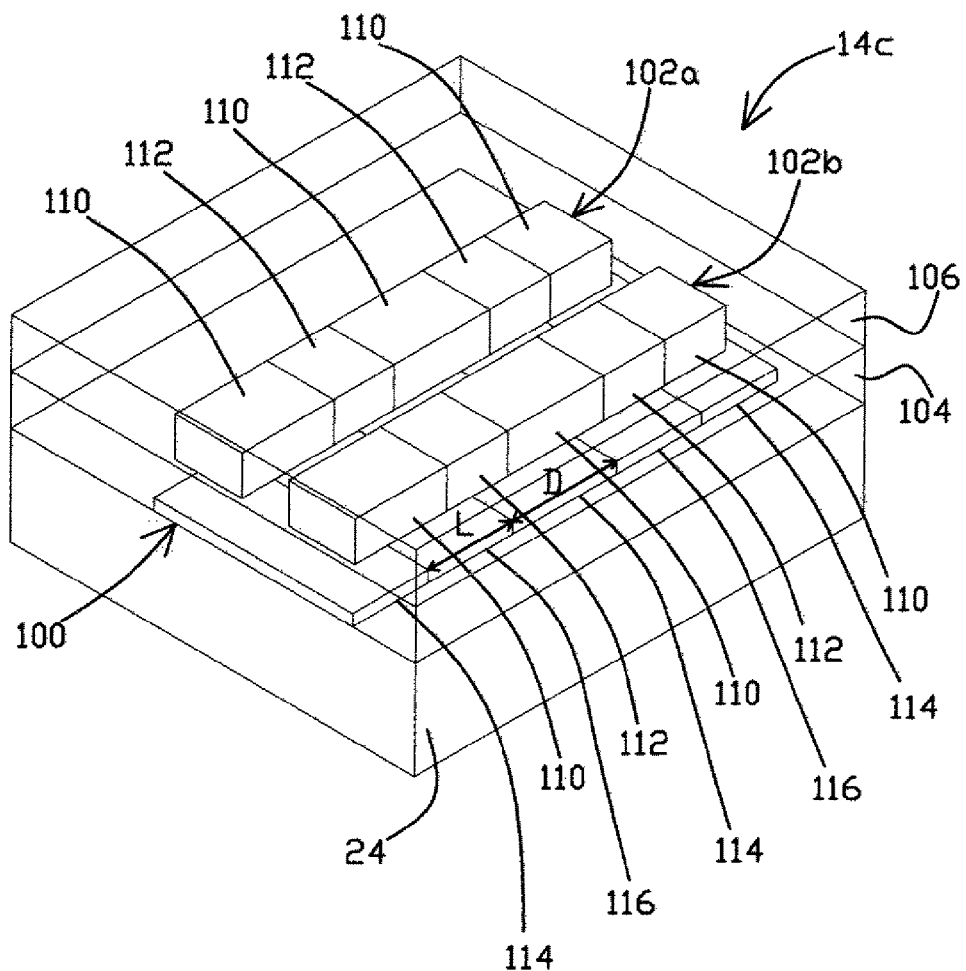
FIG. 5 is a perspective view of a portion of a lead and a ground plane including a pattern of lossy metal, according to an embodiment of the present invention.
Figure 6:
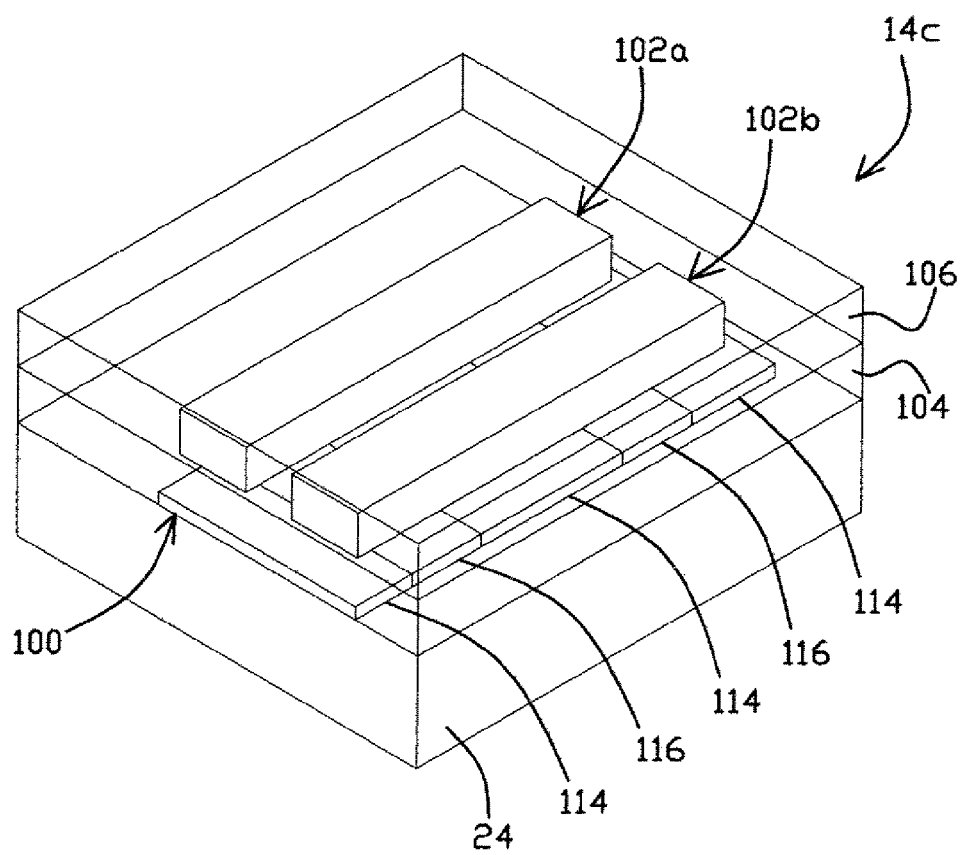
FIG. 6 is a perspective view of a portion of a flexure with a ground plane including a pattern of lossy metal, according to an embodiment of the present invention.

FIG. 5 is a perspective view of a flexure 14c according to an embodiment of the present invention including a spring metal layer 24, a ground plane 100, leads 102a and 102b, a dielectric layer 104, and a cover coat layer 106. The dielectric layer 104 electrically isolates the leads 102a and 102b from the ground plane 100 and the spring metal layer 24. The dielectric layer 104 may be comprised of materials similar to those described above with regard to dielectric layer 50 in FIG. 2. The cover coat layer 106 may be comprised of a dielectric material and is formed over the leads 102a and 102b as a protective layer for the flexure 14c and to electrically isolate the leads 102a and 102b from other electrical components in the disk drive system. The flexure 14c may also include an additional dielectric layer between the spring metal layer 24 and the ground plane 100.

The leads 102a and 102b are each comprised of a conductive trace material 110 and a plurality of spaced-apart elements 112 made of lossy material. The leads 102a and 102b, and the configuration and materials of the conductive trace material 110 and spaced-apart elements 112, may be substantially similar to that described above with regard to the leads 20a and 20b in FIG. 3. In an alternative embodiment, shown in FIG. 6, the leads 102a and 102 are comprised only of a conductive trace material.

The ground plane 100 is comprised of a ground plane material 114 and a plurality of spaced-apart elements 116 made of lossy material. The ground plane 100 may be continuous along the entire length of the flexure 14 shown in FIG. 2. The ground plane material 114 may be comprised of copper or a copper alloy. The lossy material of spaced-apart elements 116 is a conductive material that is electrically connected with the ground plane material 114. In some embodiments, the spaced-apart elements 116 comprise layers of lossy material formed over a constant layer of the ground plane material 114. For example, the spaced-apart elements 116 may be plated on the constant layer of the ground plane material 114 using known techniques. In other embodiments, the spaced-apart elements 116 comprise strips of lossy material interspersed with strips of the ground plane material 114. The spaced-apart elements 116 may be made of any lossy material that reduces the bandwidth of the ground plane 100 while having a minimal effect on the impedance of the ground plane 100. The lossy material of spaced-apart elements 116 has a loss tangent greater than the loss tangent of the ground plane material 114. Example lossy materials suitable for the spaced-apart elements 116 include, but are not limited to, Ni, steel, W, NiCr, Al, Cr, Fe, and alloys thereof.

The spaced-apart elements 116 may be configured to control the bandwidth of the ground plane 100. For example, in embodiments in which the spaced-apart elements 116 are formed over a layer of ground plane material 114, the thickness of the spaced-apart elements 116 may be controlled to provide the desired bandwidth while minimizing the effect of the spaced-apart elements 116 on the impedance of the ground plane material 114. In some embodiments, the thickness of the spaced-apart elements 116 is about 0.5-5.0 μm. In addition, the length L of each of the spaced-apart elements 116 and the distance D between each of the spaced-apart elements 116 may be selected to control the bandwidth of the ground plane 100. For example, the length L of the spaced-apart elements 116 may be between about 10% and about 90% of the total length of the total length of the leads 102a and 102b. Furthermore, the pattern of the spaced-apart elements 116 may also be varied along the flexure 14c to provide different responses along the length of the ground plane 100. In some embodiments, the pattern of the spaced-apart elements 116 is constant (i.e., the length L and distance D are constant) along the length of the flexure 14c.

Figure 7:
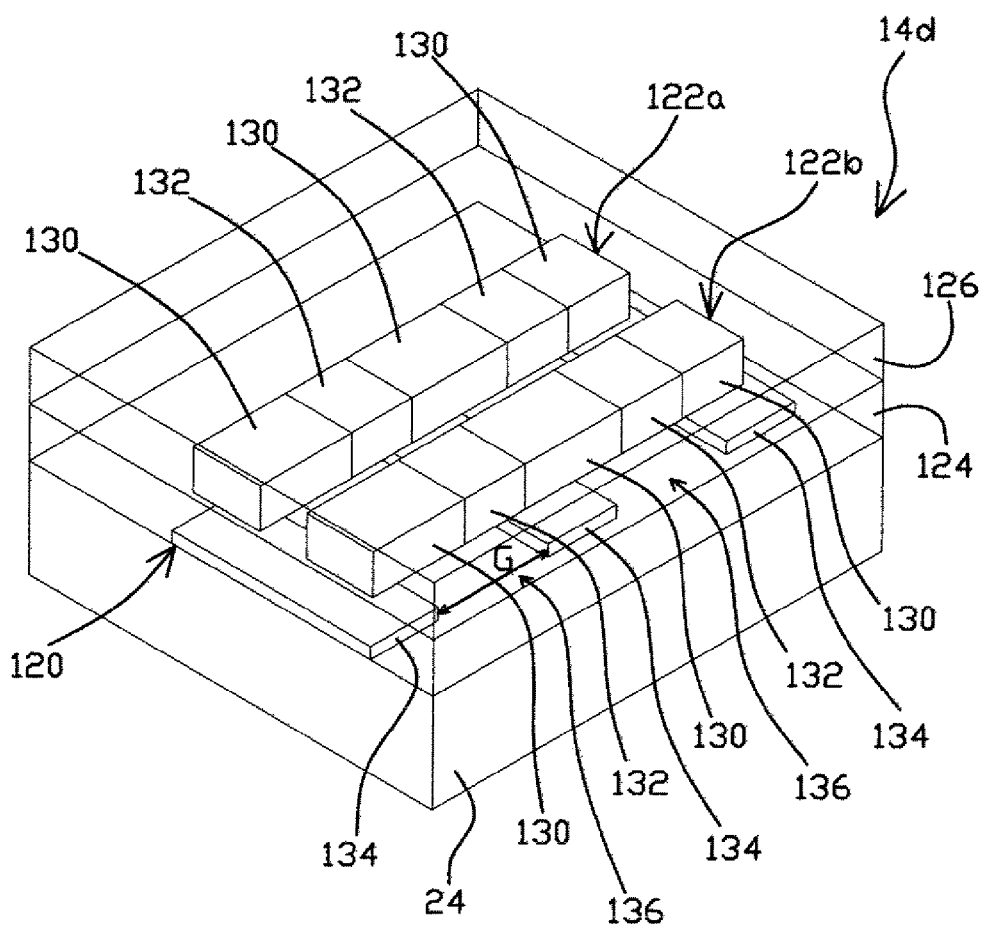
FIG. 7 is a perspective view of a portion of a lead including a pattern of lossy metal and a ground plane including strips of conductive material, according to an embodiment of the present invention.
Figure 8:
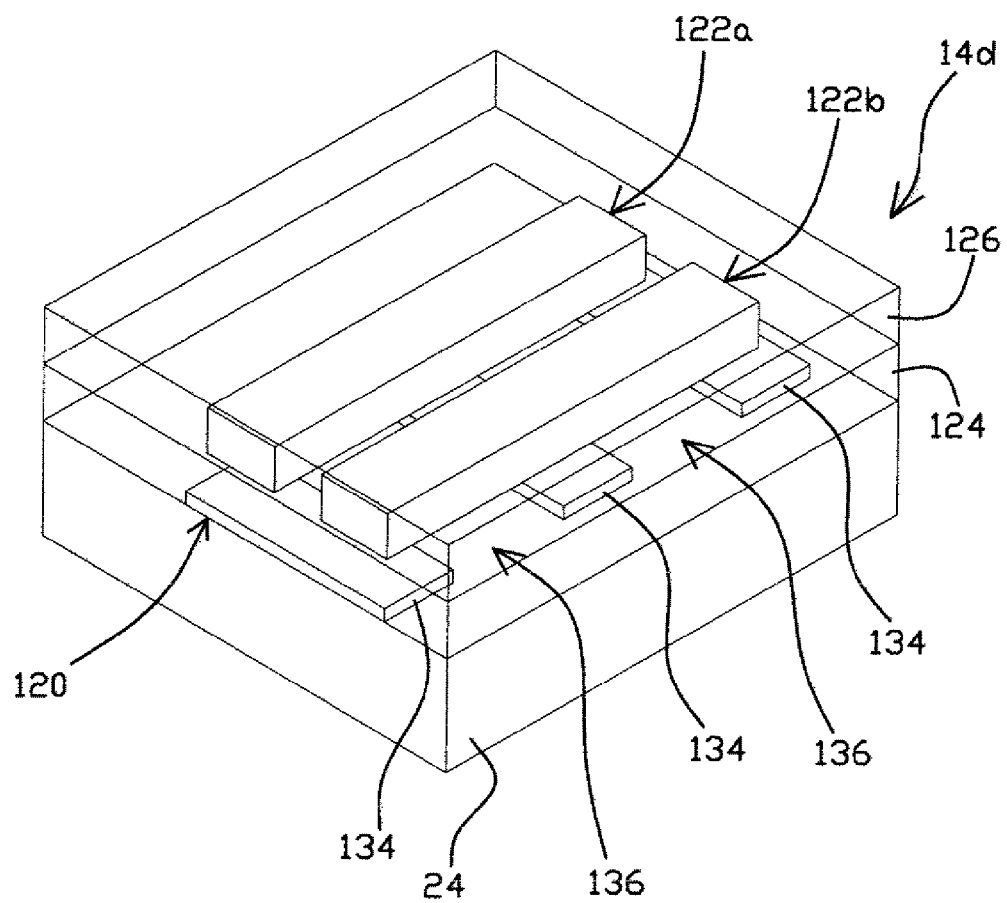
FIG. 8 is a perspective view of a portion of a flexure with a ground plane including strips of conductive material, according to an embodiment of the present invention.

FIG. 7 is a perspective view of a flexure 14d according to an embodiment of the present invention including a spring metal layer 24, a ground plane 120, leads 122a and 122b, a dielectric layer 124, and a cover coat layer 126. The dielectric layer 124 electrically isolates the leads 122a and 122b from the ground plane 120 and the spring metal layer 24. The dielectric layer 124 may be comprised of materials similar to those described above with regard to dielectric layer 50 in FIG. 2. The cover coat layer 126 may be comprised of a dielectric material and is formed over the leads 122a and 122b as a protective layer for the flexure 14d and to electrically isolate the leads 122a and 122b from other electrical components in the disk drive system. The flexure 14d may also include an additional dielectric layer between the spring metal layer 24 and the ground plane 120.

The leads 122a and 122b are each comprised of a conductive trace material 130 and a plurality of spaced-apart elements 132 made of lossy material. The leads 122a and 122b, and the configuration and materials of the conductive trace material 130 and spaced-apart elements 132, may be substantially similar to that described above with regard to the leads 20a and 20b in FIG. 3. In an alternative embodiment, shown in FIG. 8, the leads 122a and 122b are comprised only of a conductive trace material.

The ground plane 120 is comprised of strips 134 of a ground plane material separated by gaps 136. The strips 134 of ground plane ground plane material are electrically coupled with spring metal layer 24. The spring metal layer 24 may be comprised of stainless steel, which is a lossy metal. Consequently, when current is returned through the ground plane 120, the current alternately passes through the strips 134 and the spring metal layer 24. This reduces the bandwidth of the ground plane 120 but has a minimal effect on the impedance of the ground plane 120. The gap length G may be controlled to provide the desired bandwidth of the ground plane 120. In addition, the strips 134 separated by the gaps 136 preserve the differential timing symmetry between the leads 122a and 122b. The gap length G can also be controlled to maintain equal time delays for each lead 122a and 122b.

In summary, the present invention relates to an integrated lead flexure including a base region and a gimbal extending from the base region and having a slider mounting region. A conductive assembly, which is configured to carry current between the slider mounting region and the base region, includes a current carrying structure electrically connected with a pattern of conductive lossy material. The pattern of conductive lossy material is configured to reduce a bandwidth of the current carrying structure. The conductive lossy material has very little effect on the impedance of the current carrying structure, but can be formed to control the bandwidth of the conductive assembly. For example, increasing the ratio of the conductive lossy material to the material of the current carrying structure reduces the bandwidth of the conductive assembly. With a smaller bandwidth, the amount of signal reflections in the conductive assembly is reduced.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

The following is claimed:

1. An integrated lead flexure, comprising:
   a base region;
   a gimbal extending from the base region and having a slider mounting region; and
   a conductive assembly configured to carry current between the slider mounting region and the base region, wherein the conductive assembly includes one or more conductive leads including a first conductive material, and wherein at least some of the one or more conductive leads include a pattern of conductive lossy material, and wherein the pattern of conductive lossy material reduces a bandwidth of the conductive assembly.

2. The integrated lead flexure of claim 1, wherein the pattern of conductive lossy material comprises a plurality of spaced-apart layers of lossy material formed on the at least some of the one or more conductive leads.

3. The integrated lead flexure of claim 1, wherein the conductive lossy material has a lower electrical conductivity than the first conductive material.

4. The integrated lead flexure of claim 1, wherein the pattern of conductive lossy material comprises a plurality of lossy material strips interspersed on the conductive assembly.

5. The integrated lead flexure of claim 1, wherein a plurality of the conductive leads include a pattern of conductive lossy material.

6. The integrated lead flexure of claim 5, wherein the flexure includes one or more apertures, and wherein at least some of the one or more conductive leads overlay the one or more apertures.

7. The integrated lead flexure of claim 1, and further comprising a ground plane.

8. The integrated lead flexure of claim 7, wherein the ground plane comprises a plurality of spaced-apart conductive strips arranged on a layer of lossy material.

9. The integrated lead flexure of claim 1, wherein the pattern of conductive lossy material is only proximate the slider mounting region.

10. The integrated lead flexure of claim 1, wherein the pattern of conductive lossy material is only proximate a tail region of the integrated lead flexure.

11. The integrated lead flexure of claim 1, wherein the lossy material is selected from the group consisting of Ni, steel, W, NiCr, Al, Cr, Fe, and alloys thereof.

12. An assembly for carrying current along a flexure of an integrated lead suspension, the assembly comprising:
    a current carrying structure having an impedance; and
    one or more conductive leads including a pattern of conductive lossy material electrically connected to the current carrying structure, wherein the pattern of conductive lossy material reduces a bandwidth of the current carrying structure while minimally affecting the impedance of the current carrying structure.

13. The assembly of claim 12, wherein the pattern of conductive lossy material comprises a plurality of spaced-apart layers of lossy material formed on the current carrying structure.

14. The assembly of claim 12, wherein the pattern of conductive lossy material comprises a plurality of lossy material strips interspersed with portions of the current carrying structure.

15. The assembly of claim 12, wherein the current carrying structure comprises a plurality of the conductive leads.

16. The assembly of claim 15, wherein the flexure includes one or more apertures, and wherein the at least some of the plurality of conductive leads overlay the one or more apertures.

17. The assembly of claim 12, wherein the current carrying structure comprises a ground plane.

18. The assembly of claim 17, wherein the ground plane comprises a plurality of spaced-apart conductive strips arranged on a layer of lossy material.

19. The assembly of claim 12, wherein the lossy material is selected from the group consisting of Ni, steel, W, NiCr, Al, Cr, Fe, and alloys thereof.

\* \* \* \* \*